(12) United States Patent
Vennetier et al.

(10) Patent No.: US 7,524,098 B2
(45) Date of Patent: Apr. 28, 2009

(54) SOLID-STATE LATERAL EMITTING OPTICAL SYSTEM

(75) Inventors: Perig Vennetier, San Francisco, CA (US); Jean-Yves Naulin, Richmond, CA (US)

(73) Assignee: Dicon Fiberoptics, Inc., Richmond, CA (US)

( * ) Notice: Subject to any disclaimer, the term of this patent is extended or adjusted under 35 U.S.C. 154(b) by 195 days.

(21) Appl. No.: 11/549,026

(22) Filed: Oct. 12, 2006

(65) Prior Publication Data
US 2008/0089062 A1  Apr. 17, 2008

(51) Int. Cl.
*F21V 8/00* (2006.01)
(52) U.S. Cl. .................. 362/555; 362/327; 359/727
(58) Field of Classification Search ................ 362/612, 362/555, 327, 332, 335, 800; 385/146; 359/727, 359/729; 257/98
See application file for complete search history.

(56) References Cited

U.S. PATENT DOCUMENTS

| 6,598,998 B2 | 7/2003 | West et al. |
| 6,607,286 B2 | 8/2003 | West et al. |

(Continued)

OTHER PUBLICATIONS

"Side-Emitting Optic," Led Optics, Carclo precision optics, ToyLite Technologies Corporation, 2 pages.

(Continued)

*Primary Examiner*—Stephen F. Husar
*Assistant Examiner*—Peggy A. Neils
(74) *Attorney, Agent, or Firm*—Davis Wright Tremaine LLP

(57) ABSTRACT

The optical lens embodiment of the invention refracts and reflects light emitted from the light emitting diode chips on a unique combination of curved surfaces to obtain the desired coupling to a lateral light guide. The system of curved surfaces redirects rays from multiple LED chips laterally by multiple refraction and/or reflection. The optical lens has an optical axis, and comprises a bottom surface and a curved reflecting surface having a concave side. The concave side is oriented to face said bottom surface at an oblique angle. The reflecting surface surrounds the optical axis. The lens comprises a first curved refracting surface having a concave side facing the concave side of the reflecting surface and a second refracting surface extending as a smooth curve from the bottom surface to the first refracting surface. Light entering the lens through the bottom surface and directly incident on the reflecting surface is reflected from the reflecting surface at its concave side to the first refracting surface and refracted by the first refracting surface to exit the lens in a lateral direction with respect to the optical axis of the lens. A first portion of light entering the lens through the bottom surface and directly incident on the second refracting surface is refracted by the second refracting surface to exit the lens in a lateral direction with respect to the optical axis of the lens. A second portion of light entering the lens through the bottom surface and directly incident on the second refracting surface is refracted by the second refracting surface to the first refracting surface, refracted by the first refracting surface to the reflecting surface, reflected by the reflecting surface at its concave side to the first refracting surface and refracted by the first refracting surface to exit the lens in a lateral direction with respect to the optical axis of the lens.

21 Claims, 10 Drawing Sheets

U.S. PATENT DOCUMENTS

| | | | |
|---|---|---|---|
| 6,679,621 B2 | 1/2004 | West et al. | |
| 7,083,313 B2 * | 8/2006 | Smith | 362/555 |
| 7,153,002 B2 * | 12/2006 | Kim et al. | 362/327 |
| 7,329,029 B2 * | 2/2008 | Chaves et al. | 362/329 |
| 2006/0034097 A1 * | 2/2006 | Hahm et al. | 362/555 |
| 2006/0126343 A1 * | 6/2006 | Hsieh et al. | 362/327 |

OTHER PUBLICATIONS

"Luxeon DCC for LCD Backlighting," Lumileds Lighting U.S., LLC, Jan. 2005, 38 pages.

Folkerts, "41.3: Invited Paper: LED Backlighting Concepts with High Flux LEDs," SID 04 Digest, ISSN/0004-0966X/04/3502-1226, pp. 1226-1229.

West et al., "43.4: High Brightness Direct LED Backlight for LCD-TV," SID 03 Digest, ISSN/0003-0966X/03/3403-0694, 4 pages.

* cited by examiner

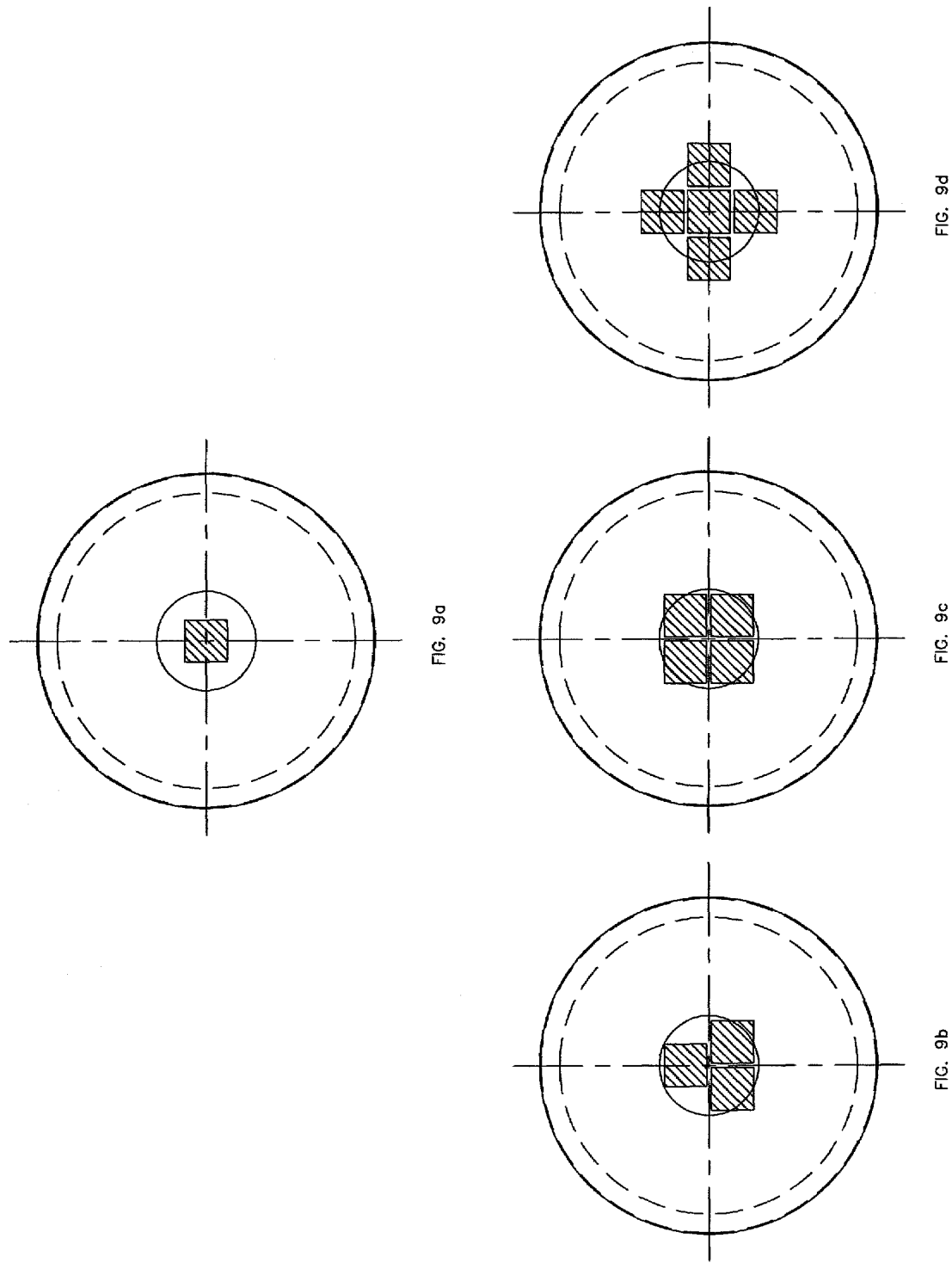

SOLID-STATE LATERAL EMITTING OPTICAL SYSTEM

BACKGROUND OF THE INVENTION

Recent progresses in the field of Light Emitting Diodes (LEDs) have opened the field to new families of applications.

Improvements of internal quantum efficiency and improvement of the extraction efficiency strategies have led to LED chips that deliver high flux. By using high performance packages, LED-based devices at higher driving currents have been developed. Consequently, performance and reliability of LED-based devices have reached new standards, opening ways for high brightness, color-sensitive applications. With this level of performance, LEDs have become a viable alternative to Cold Cathode Fluorescent Lamp (CCFL) for LCD backlighting.

Compared to CCFL, LEDs offer a new level of flexibility to LCD designers. New generations of LEDs promise to reshape and eventually reduce power consumption. They also offer the possibility of an independent control of various combinations to produce the desired lighting effect.

For example, the response time of LEDs is much faster than the response time of CCFL and obviously much faster than the typical response time of the human eye. It is therefore possible to modulate sequentially the different LED chips to obtain the desired optical properties in terms of light level or color rendering. These factors contribute to the adoption of LEDs for LCD backlighting in place of CCFL. However some issues remain.

The lenses described in prior art for single chip devices are suited for operation with a single on-axis light-emitting chip (U.S. Pat. Nos. 6,598,998/6,607,286/6,679,621). The dimensions of the lenses are typically 7 mm in diameter and 4 mm in height. Any variation of the position of the chip leads to a failure of the Total Internal Reflection (TIR) principle and undesired redirection of light outside of the desired angle for both TIR and reflective-coating designs.

Moreover single chip devices present several limitations for backlighting applications. For example each device emits a single color. When multiple single chip LED devices are used, the color mixing elements of the LCD backlighting system must take up the heavy burden of controlling the mixing of the different color light generated by the multiple single chip LED devices to deliver light of the desired color. Moreover, a LCD with multiple single-chip devices requires several layers of lightguide, light diffusers, and light shapers. Each of these elements reduces the overall light transmission of the system.

Multichip and multicolor LED devices perform a localized color mixing within the devices by controlling the light emission of the LED devices. This feature reduces the number of light diffusers and light shapers inside the LCD system. The transmittance of the system is improved as well as the overall brightness on the projection screen.

For multichip designs, the chips are not centered on the optical axis of the lens. Performances as low as 10-20% of light redirected laterally would be obtained with a lens for a single chip system. The major reason for the drop in performance is that light is emitted from a much wider area that can be at least 4 times larger than that of a single chip.

One solution can be to scale-up the dimensions of the optical lens. For example, for a 4-chip design the dimension of the lens can be multiplied by a factor 4 to keep the same level of performance. It means the dimensions of the lens would be typically 28 mm in diameter and 16 mm in height. This would be a barrier for any LCD application. The size, the weight and the cost of the lens would be far beyond the requirements of LCD TV and projectors.

It is therefore desirable to provide a new optical system that redirects and couples an optimal amount of light emitted by multiple light emitting diode chips into a lateral lightguide and therefore provide uniform illumination on the LCD screen.

SUMMARY OF THE INVENTION

The optical lens refracts and reflects light emitted from the light emitting chips on a unique combination of curved surfaces in the lens to obtain the desired coupling to the lateral lightguide. The system of curved surfaces redirects rays from multiple LED chips laterally by multiple refractions and/or reflections.

In one embodiment of the invention, a lens having an optical axis, and comprises a bottom surface and a curved reflecting surface having a concave side, wherein said concave side is oriented to face said bottom surface at an oblique angle, said reflecting surface surrounding said optical axis. The lens comprises a first curved refracting surface having a concave side facing the concave side of the reflecting surface and a second refracting surface extending as a smooth curve from the bottom surface to the first refracting surface.

In this embodiment, light entering the lens through the bottom surface and directly incident on the reflecting surface is reflected from the reflecting surface at its concave side to the first refracting surface and refracted by the first refracting surface to exit the lens in a lateral direction with respect to the optical axis of the lens. A first portion of light entering the lens through the bottom surface and directly incident on the second refracting surface is refracted by the second refracting surface to exit the lens in a lateral direction with respect to the optical axis of the lens. A second portion of light entering the lens through the bottom surface and directly incident on the second refracting surface is refracted by the second refracting surface to the first refracting surface, refracted by the first refracting surface to the reflecting surface, reflected by the reflecting surface at its concave side to the first refracting surface and refracted by the first refracting surface to exit the lens in a lateral direction with respect to the optical axis of the lens.

All patents, patent applications, articles, books, specifications, other publications, documents and things referenced herein are hereby incorporated herein by this reference in their entirety for all purposes. To the extent of any inconsistency or conflict in the definition or use of a term between any of the incorporated publications, documents or things and the text of the present document, the definition or use of the term in the present document shall prevail.

BRIEF DESCRIPTION OF THE DRAWINGS

FIGS. 9a-9d represent top views of the system for different chips arrangements.

For simplicity in description, identical components are labeled by the same numerals in this application.

DETAILED DESCRIPTION OF THE PREFERRED EMBODIMENTS

Integrating multiple LED chips with same or different colors in a compact compartment, as a lateral emitting cell is desirable for better color control, color mixing and lower cost. But it is very difficult to manage light output from multiple light chips with a single lens. Previous art provides solutions for a light cell with a single chip. However to the best of our knowledge, none of them describes an efficient solution based on a single lens for multiple chips.

The embodiments of this present invention provide a lens that will accommodate at least 2 light emitting chips and couple about 90% of the light emitted by these chips into a lightguide. The embodiments achieve such a high coupling efficiency while keeping the lateral and vertical dimensions of the lens preferably less than five times the lateral dimension of the light emitting area.

In one embodiment of the invention, the reflective surface is uncoated and the reflection is caused by total internal reflection (TIR). In another embodiment of the present invention, the reflective surface is coated with a reflective coating.

In one embodiment of the invention, all LED chips have identical spectral distribution. In another embodiment of the invention, for each of the LED chips, the spectral distribution is different. The combination of the different spectra allows a suitable color mixing to produce a wide range of white light with a correlated color temperature (CCT) that matches the requirements of the application.

In another embodiment of the invention, LED chips with different spectral distribution are powered sequentially and provide a dynamic color emission.

In the various embodiments of the present invention, the optical lens characteristics are adapted to fit these requirements.

Figure 1:
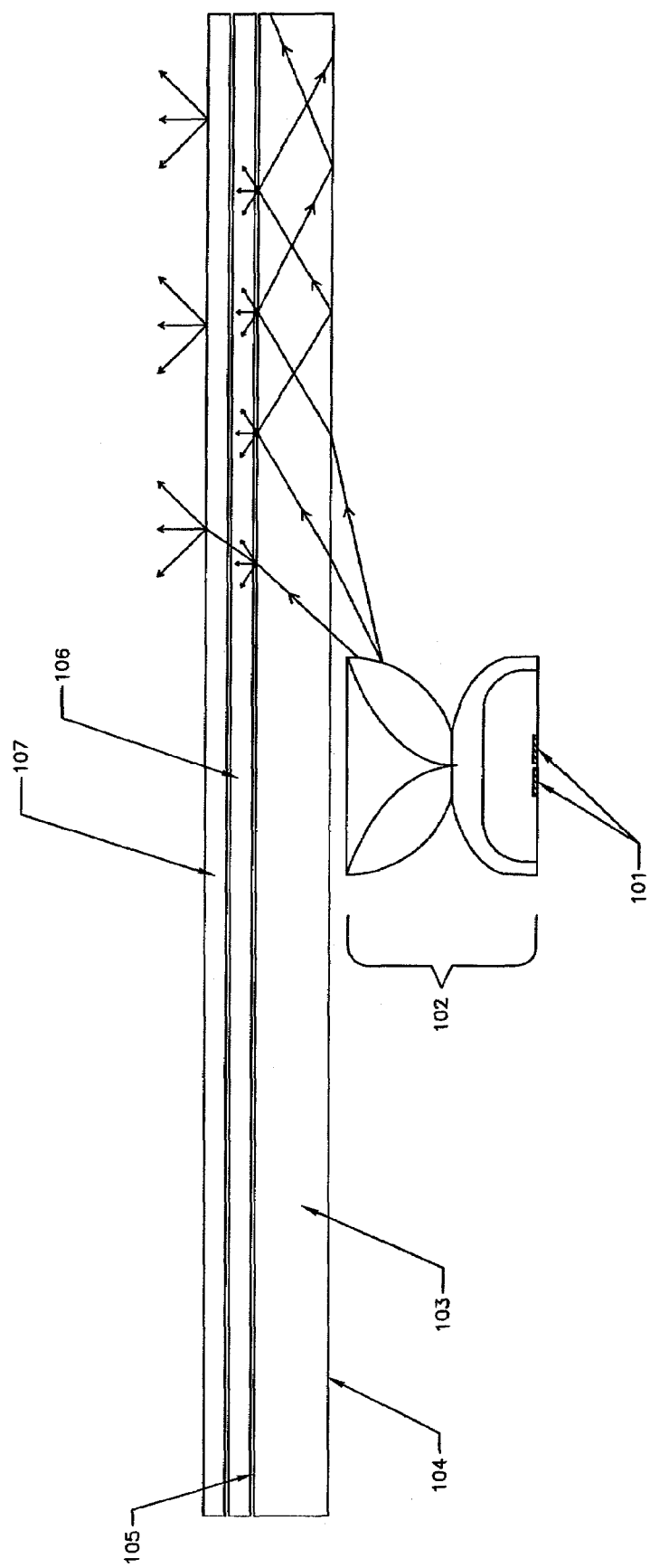
FIG. 1 illustrates a general design of the basic integration of one embodiment of the present invention for backlighting application.

FIG. 1 illustrates a general design of the basic integration of the present invention for backlighting application where the design includes an optical system or lens 102, multiple chips 101, a lightguide 103, a diffuser 106 and an optional light shaper 107. Light emerges laterally from the optical system 102 and is coupled into the lightguide 103. Light being refracted by the lens 102 is directed laterally and hit the bottom surface 104 of the lightguide 103. The rays are then refracted in the material and coupled into the lightguide. They will propagate inside the guide by multiple total internal reflections on the surfaces 104 and 105. The lightguide 103 can be made of plastic or polymer materials with an index of refraction in the range of 1.4 to 1.7 and can have one or more rough or diffusing surfaces. So, a percentage of the light will be transmitted by scattering at each reflection and will go through the diffuser 106 and light shaper 107 which will homogenize the light distribution further more.

Figure 2:
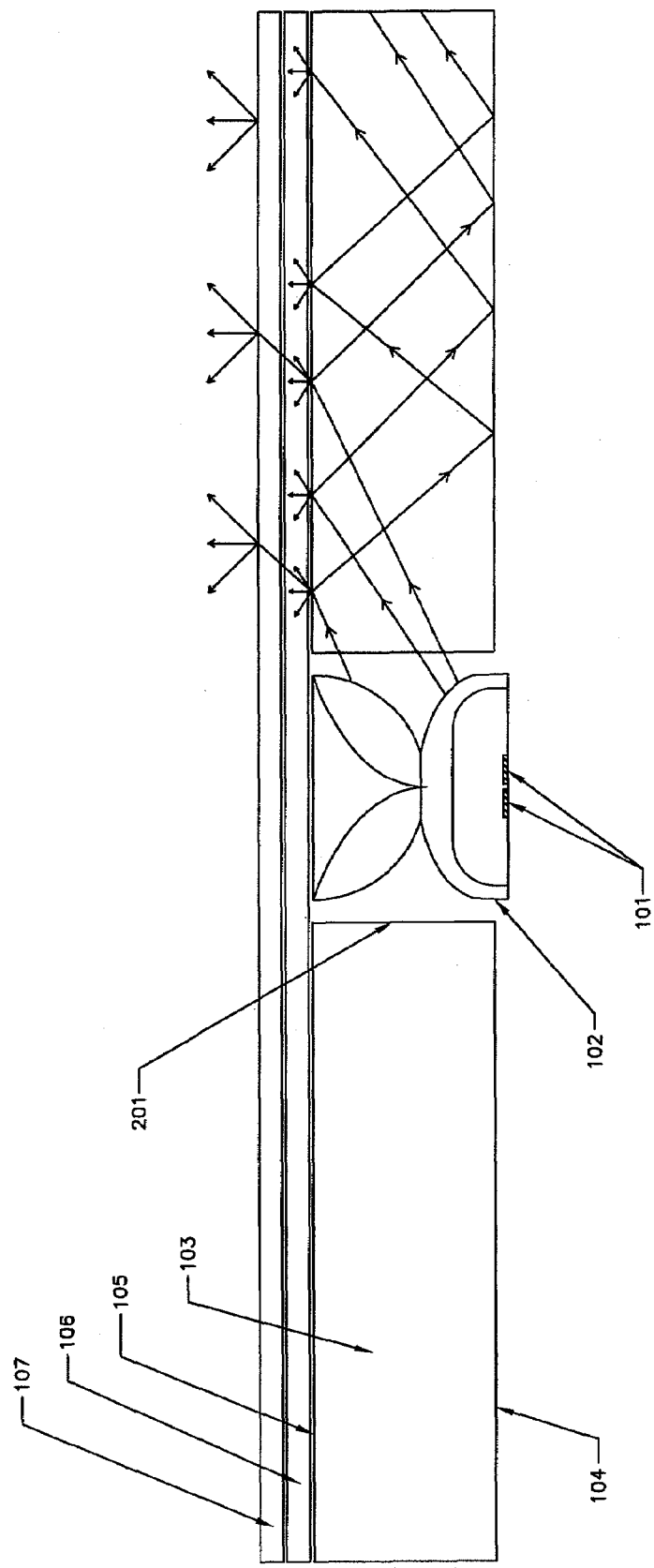
FIG. 2 illustrates another integration of the present invention for backlighting application to illustrate another embodiment.

FIG. 2 illustrates another integration of the present invention where system 102 couples the light into a lightguide 103, which is drilled with holes where each of a number of optical systems 102 is inserted into each of the holes. In each of the holes, one face 201 of the lightguide is then facing directly the sides of the corresponding lens in the hole and all the rays exiting the lens will hit the surface 201 and be refracted inside the guide. The light rays will propagate by multiple total internal reflections on the surfaces 104 and 105. In the same way as in the previous configuration, the light will be transmitted by scattering through the diffuser 106 and the light shaper 107 and will be homogeneously transmitted.

Figure 3B:
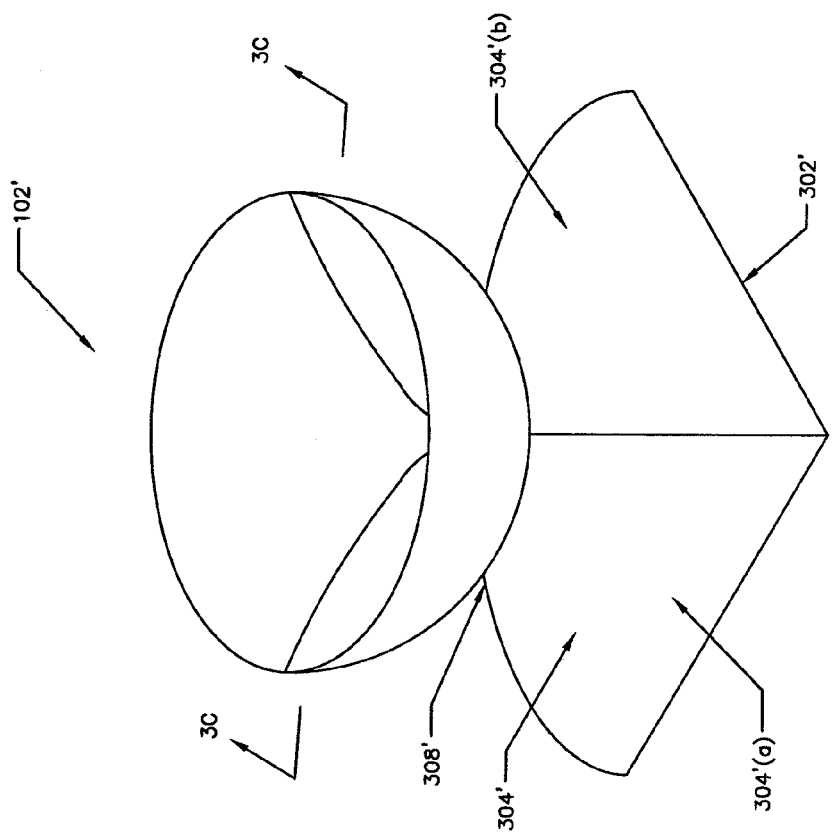
FIG. 3b is a 3-dimensional perspective view of the lens in an optical system of another embodiment of the present invention.
Figure 3A:
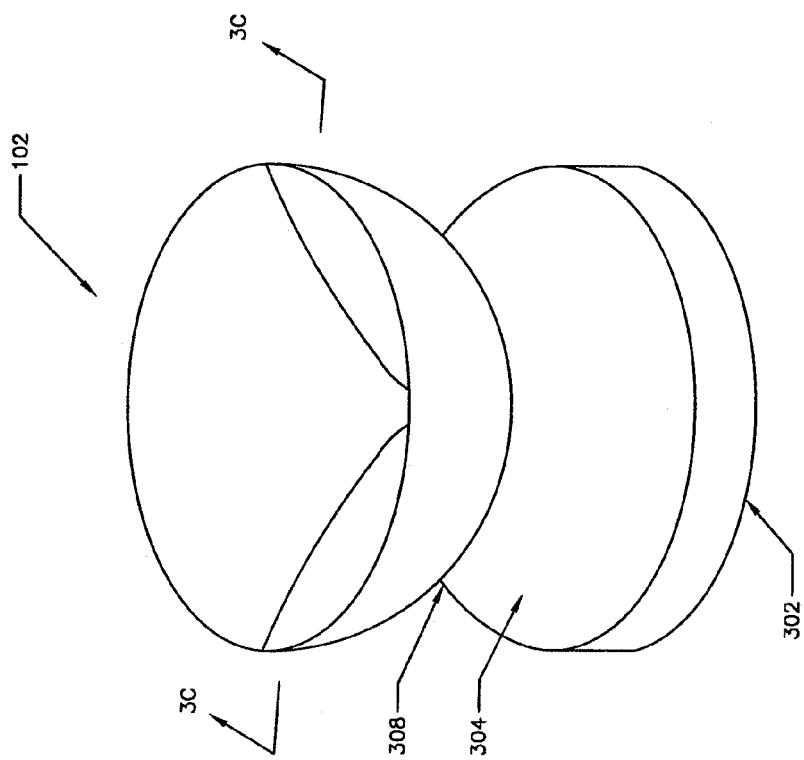
FIG. 3a is a 3-dimensional perspective view of the lens in an optical system of one embodiment of the present invention.

FIGS. 3a and 3b represent two possible 3-dimensional perspectives of the optical system of the present invention used to efficiently redirect laterally the optical rays emitted from multiple LED chips. In the embodiment of FIG. 3a the bottom surface 302 and surface 304 of the optical system or lens 102 has a rotational symmetry around the optical axis of the system. In another embodiment of the invention shown in FIG. 3b, the bottom surface 302' can have a quadrant (square base or rectangular base) or multifaceted symmetry, and curved surface 304' has the shape of a pyramid, with a square or rectangular base, and four curved triangular surfaces, only two of which are visible in FIG. 3b (304'(a) and 304'(b)). The geometry of the curved surface 304' permits the light emitted by the light emitting chips with light emitting areas arranged in a generally square or rectangular configuration to be directed in preferred horizontal directions around the optical axis. The shapes of the light emitting areas will then match the shapes of the surfaces in arrangements of individual light emitting optical systems or lenses 102 and 102' on the LCD backlight panel to provide optimal lighting uniformity.

Figure 3C:
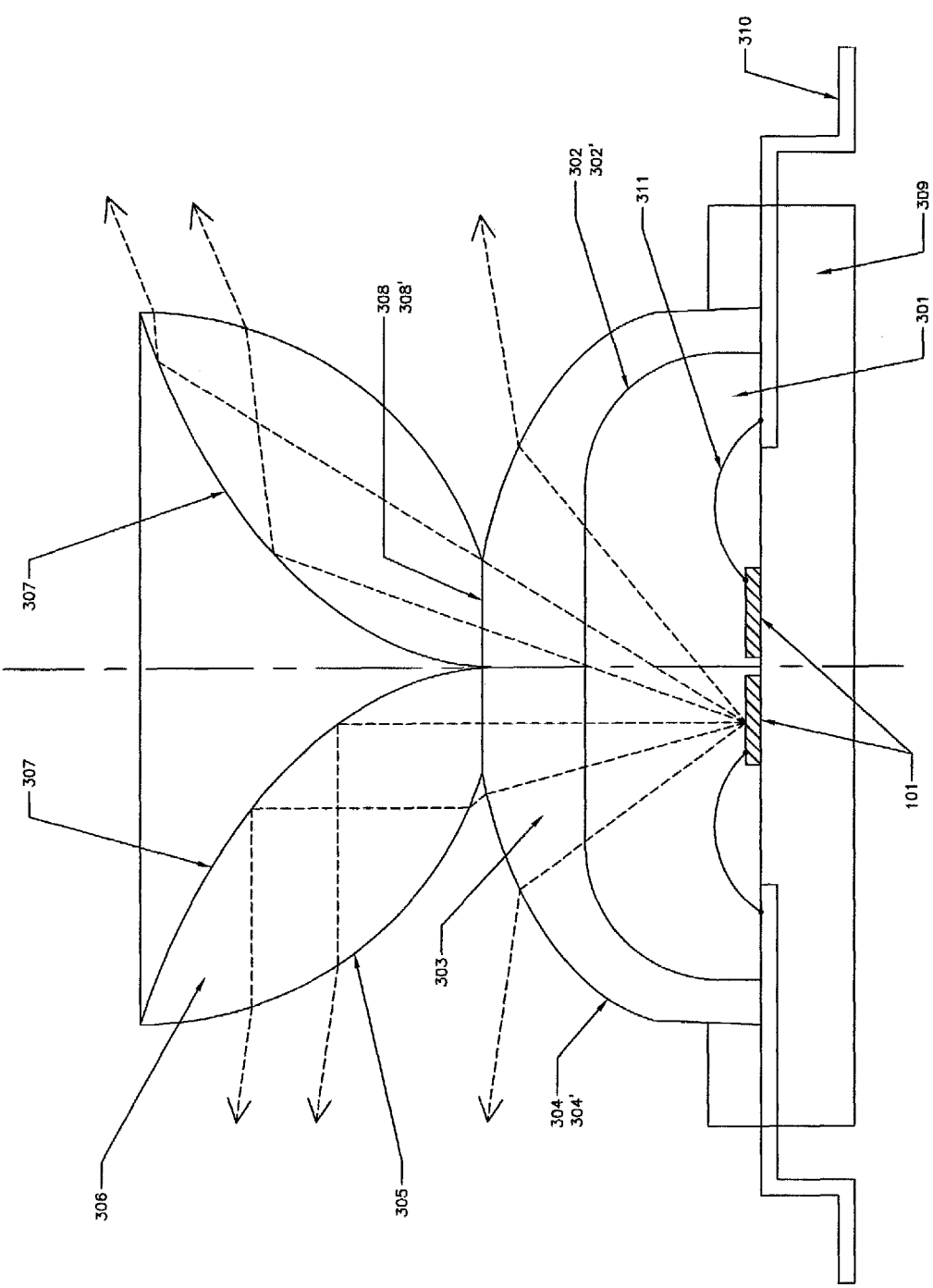
FIG. 3c is the cross section view of FIGS. 3a and 3b, along the lines 3c-3c in FIGS. 3a and 3b to illustrate common features in the mechanical and optical assembly of two embodiments of the present invention.

The optical systems 102 and 102' uses refraction, and either total internal reflection or reflection on a reflective surface. FIG. 3c is the cross section view of FIGS. 3a and 3b along the lines 3c-3c in FIGS. 3a and 3b and illustrates the mechanical and optical assembly of embodiments of the present invention. The lenses 102 and 102' of the embodiments of the present invention comprises a cavity 301 where multiple chips are positioned, a bottom part or portion 303 delimited by the bottom surfaces 302 or 302' and curved surfaces 304 or 304', and a top part 306 delimited by the surfaces 305 and 307. The bottom and the top parts merge together and form a neck 308 or 308'. Any surface of the lens can be flat, spherical, aspherical, parabolic, hyperbolic or elliptical depending on the geometrical configuration of the system.

One of the best configuration is for aspherical surfaces 304, 304', 305 and 307 to have a curvature defined by a polynomial equation of the type $A_i(x^6+z^6)+B_i(x^4+z^4)+C_i(x^2+z^2)+D_i(x+z)+E_iy^2=1$ in an XYZ Cartesian coordinates system. (X,Z) defining the horizontal plane and Y being the vertical axis. The coefficients $A_i, B_i, C_i, D_i, E_i$, are chosen so that there is no Total internal Reflection on the surfaces 304, 304' and also so that an optimal percentage of light emitted from the chips will either be redirected directly within the lateral lightguide acceptance angle and so other rays will be redirected optimally with the combination of surfaces 304, 305 and 307, or the combination of surfaces 304', 305 and 307. The shapes of the surfaces 304 or 304', 305 and 307 are intimately connected. The unique and complex combination of these curved surfaces gives the possibility to create an optical lens capable of reshaping the light emission pattern of a wide multiple LED chips source and redirect laterally the light.

The coefficients Ai, Bi, Ci, Di, EI, allow the optical designer to adjust the curvature of the relevant surface at a given distance from the optical axis depending on their polynomial degree. The influence of coefficients with a lower polynomial degree is more significant next to the optical axis of the system and the higher degree coefficients have more impact on the curvature at the edges of the lens for surface 304 or 304' and surface 305 and inversely for surface 307. Typically the value of $A_i$ is positive and does not exceed $10^{-3}$ while the parameters $B_i$, $C_i$, $D_i$, $E_i$ are adjusted to fit the light emitting chips configuration.

For example, for a 4 chip-configuration, a good set of parameters for the surface 304 is $\{A_{304}, B_{304}, C_{304}, D_{304}, E_{304},\}=\{0, 1.6\ 10^{-3}, 1.9\ 10^{-2}, 0, 5\ 10^{-2}\}$. Combined with this particular surface 304, the curvature of surface 305 can be defined by the following set of parameters $\{A_{305}, B_{305}, C_{305}, D_{305}, E_{305},\}=\{10^{-4}, 0, 2.7\ 10^{-5}, 4.0\ 10^{-2}, 4\ 10^{-2}\}$ and the curvature of surface 307 can be defined by parameters $\{A_{307}, B_{307}, C_{307}, D_{307}, E_{307},\}=\{10^{-7}, 0, 3.2\ 10^{-2}, 1.22\ 10^{-1}, 6.5\ 10^{-2}\}$.

The body of the lens can be molded with a material chosen for its special properties such as its index of refraction, optical transmission, wavelength irradiation life span, mechanical strength and heat resistance. The material will be chosen for example amongst PolyMethylMethAcrylate, Zeon Chemicals Zeonex®, Topas TOPAS® COC or Dow Corning SR-7010 which indexes of refraction are in the range 1.4 to 1.7.

In reference to FIG. 3c, a lead frame 309, which will provide mechanical strength and electrical connections 310, supports the optical lens 102. Bonding wires 311 may be used to connect the electrical connections of the lead frame 309 to the multiple chips 101.

Figure 4:
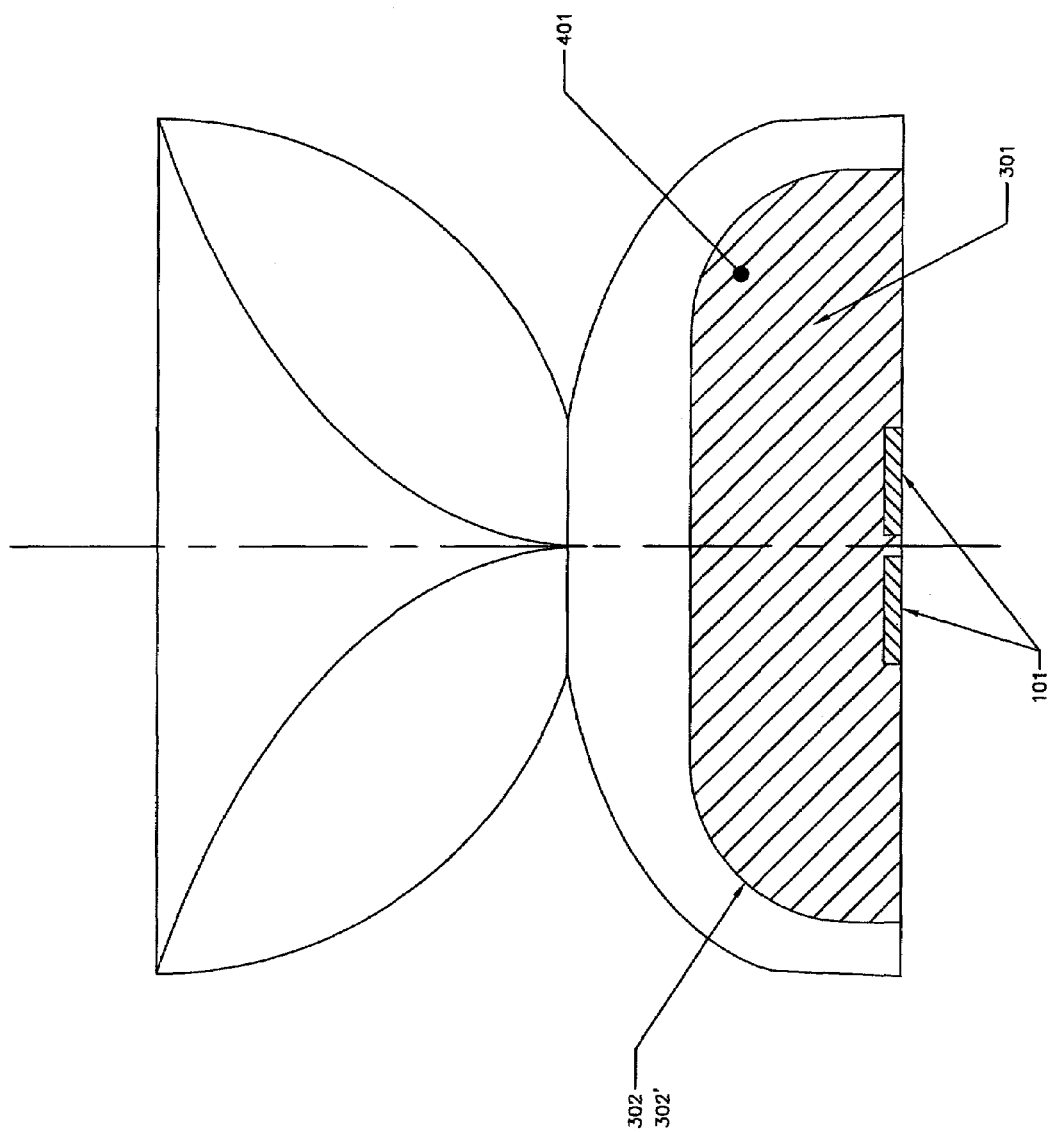
FIG. 4 illustrates the bottom part of the lens where a cavity is formed and filled with a material to illustrate another embodiment of the invention.

FIG. 4 illustrates the bottom part of the lens where a cavity 301 is created. This cavity is used to contain or hold the LED chips 101 and is preferably filled with a material 401 such as epoxy, silicone compound or gel. This material can be used for any or all of the following purpose:

1/Protect the LED chips by shielding them from humidity and provide mechanical restraints for example.

2/Increase the light scattering for color mixing and light uniformity by injection of micro or nanoparticles into the material to obtain a diffusing compound for example.

3/Match the refractive index of the optical lens, typically in the range 1.4 to 1.7.

4/Increase the light extraction by choosing the index of refraction of the material to improve the light extraction at the interface between the LED chips and the material.

Figure 5:
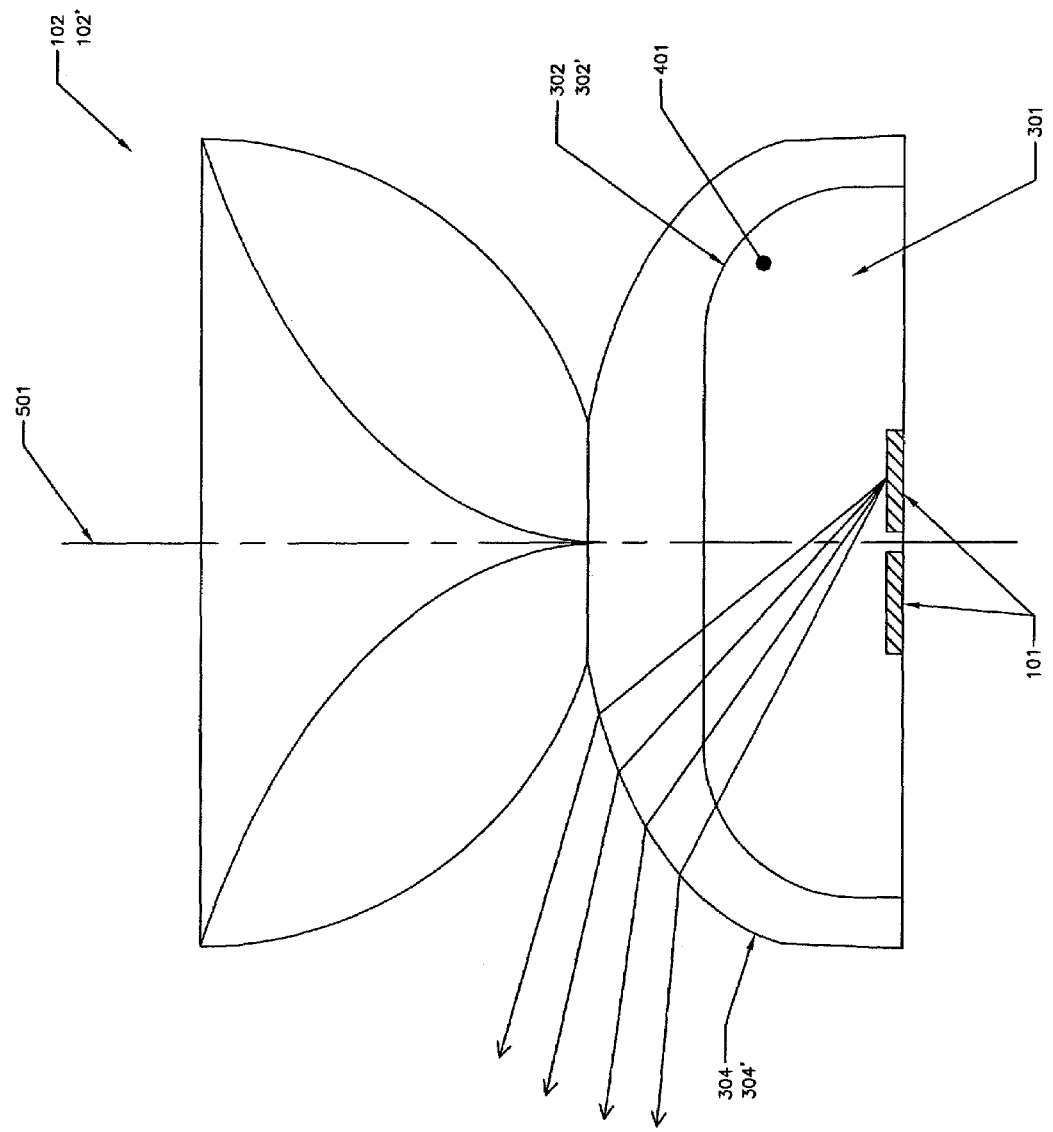
FIG. 5 illustrates the role of the curved surface 304 or 304' in FIG. 3c with the LED chips positioned inside the cavity to illustrate various embodiments of the invention.

FIG. 5 illustrates the role of the curved surface 304 or 304' of the optical system 102 or 102' with the LED chips positioned inside the cavity, which is filled with the material 401. When light is emitted from the top surface of the chips, the rays go through the material 401, hit the interface bottom surface 302 or 302', and are refracted inside the lens. Part of the rays will hit the surface 304 or 304' and will be refracted according to the Descartes-Snell's laws and the Fresnel equations. The shape of surface 304 or 304' is designed to totally avoid total internal reflection for any position of the LED chips inside the cavity so the rays will exit the lens laterally with a given angle defined by the application in which the system will be used. For TV backlighting, the exit angle of the rays to the optical axis 501 of the system will be adjusted between 50° and 90°. Such an angle permits coupling, with the maximum efficiency, of the exiting rays from the lens 102 or 102' into a lightguide, which can be positioned above or around the optical system as presented in FIGS. 1 and 2.

Figure 6:
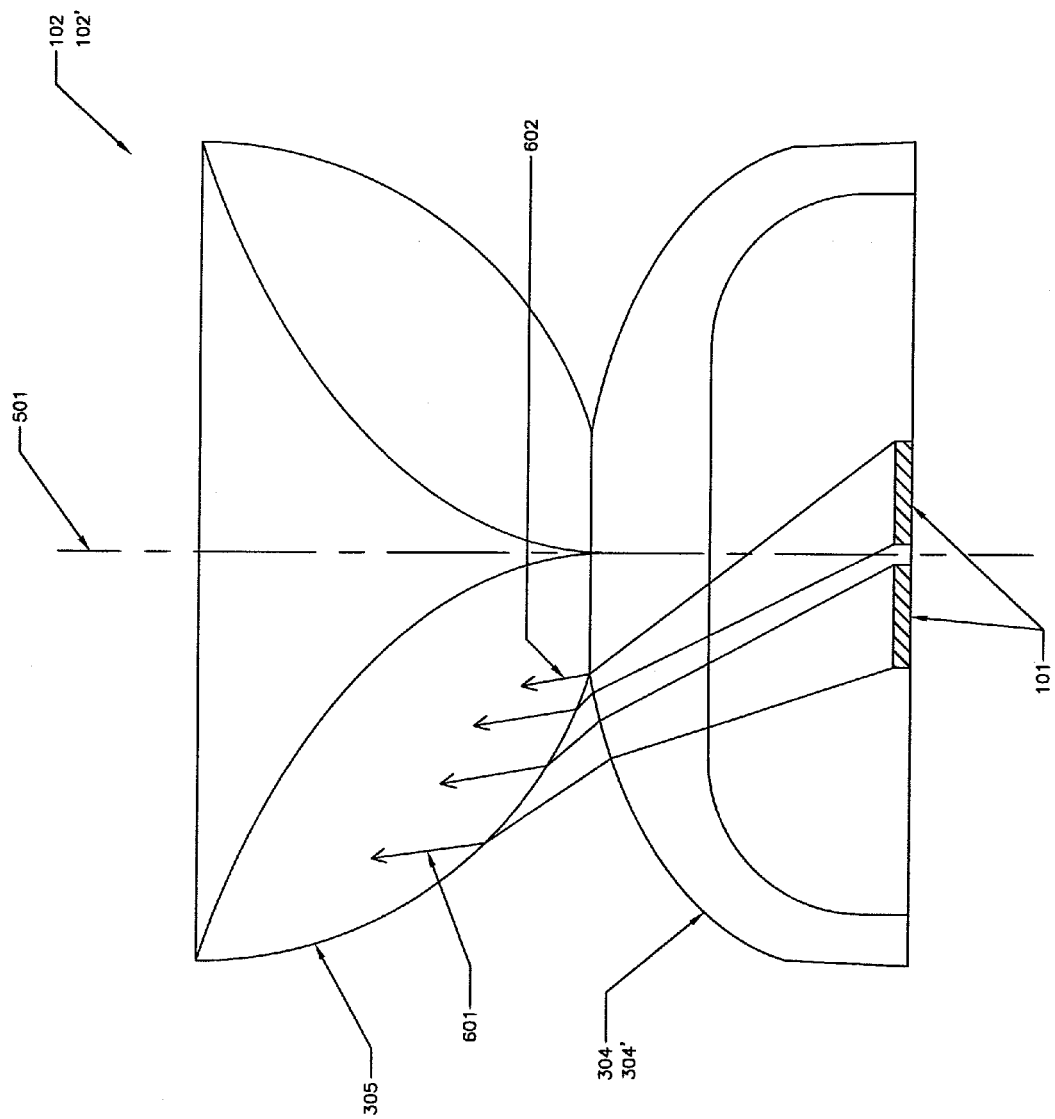
FIG. 6 illustrates the role of the surface 305 in FIG. 3c to illustrate various embodiments of the invention.

FIG. 6 illustrates the role of the surface 305, refracting, inside the lens, the rays being previously refracted by the surface 304 or 304'. Without this surface some rays would be refracted by the surface 304 or 304' with a small angle to the optical axis (vertically) and would then hit the lightguide 103 positioned above or around the lens (see FIGS. 1 and 2). They would create a very bright and non-homogeneous spot around the optical axis 501, which is undesirable. The rays 601 and 602 represent the extreme angles of a bundle of rays that will be refracted by the surface 305 and then be reflected at the surface 307 (see FIG. 7). The shape of the curved surface 305 is optimized to refract the maximum ray bundle for farther lateral reflection at surface 307.

The curvature of the surface 305 also brings a mechanical advantage. To obtain the same capacity of redirecting the limit angles (601 for example) with a flat surface, it would be necessary to have a very wide lens. Having a curved surface like 305 gives the possibility to reduce consequently the total size of the lens, save material, weight and space and consequently reduce fabrication costs.

Figure 7:
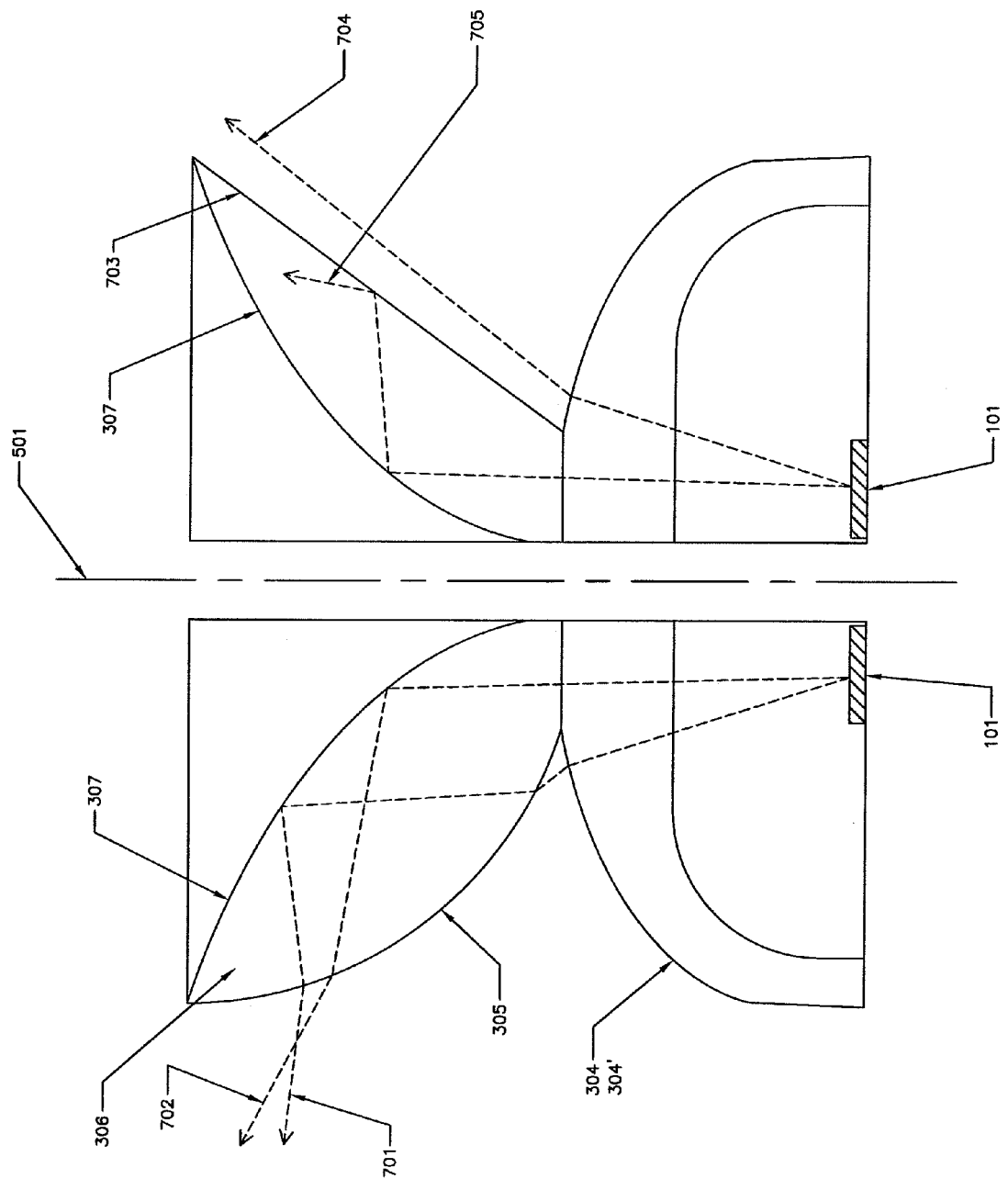
FIG. 7 is a detailed description of the characteristics and the role of the surface 305 in FIG. 3c, causing the rays to be first refracted, and then reflected in a lateral direction to illustrate various embodiments of the invention.

FIG. 7 illustrates the role of the surface 307 in reflecting two different types of rays. The first type consists of the rays (represented by ray 701) being refracted by the surface 305 as seen in FIG. 6 and the second type consists of the rays (represented by ray 702) coming directly from the chips 101, and hitting 307, without first encountering surfaces 304 or 304', or surface 305. The shape of surface 307 is designed to maximize the reflection by total internal reflection or mirror coating reflection at the interface between the surface 307 and air.

The first type of rays (701 for example) are refracted by 305, propagate inside the top part 306 of the lens and hit surface 307 with an incident angle bigger than the critical angle, resulting in total internal reflection. The critical angle can be adjusted by choosing the material for the lens, as it is determined by the index of refraction of the material. The rays are then reflected towards the sides of the lens (towards surface 305), in a lateral direction in reference to the optical axis 501 of the optical system. A lateral direction in reference to the optical axis of the system 501 means a direction within an angle of 50 to 90 degrees to the optical axis 501.

The second type of rays (702 for example) come directly from the chips 101 and hit the surface 307. The shape of the surface 307 is designed so the incident angle of these rays at the surface will be greater than the critical angle for total internal reflection, so that the rays will be reflected toward the sides of the lens (towards surface 305), in a lateral direction in reference to the optical axis 501 of the optical system.

If the optical system requires it, the surface 307 can also be coated with a metallic reflective material such as Al, Ag, Au, or a thin dielectric film or any combination of both.

In any case, once the light has been reflected by the surface 307, it propagates inside the upper part 306 of the lens, hits the side surface 305 and then exits the lens in a lateral direction in reference to axis 501. Given the shape of 305, all the rays hitting the surface are refracted laterally to outside the lens with an angle in the range of 5020 to 90° in respect to the optical axis 501 and then can be coupled in an external lightguide placed above or on the sides of the system as seen in FIGS. 1 and 2.

To show the importance of the curved surface 305 of the present invention, the optical system can be compared to a system with a flat surface 703, where the surface 305 is replaced by a flat surface 703. For easy comparison, this counter part is shown in the right side of FIG. 7. Two representative rays 704 and 705 are used for illustration purpose, where ray 704 is directed in a direction that is a mirror image of the direction of ray 701 on the left hand portion of FIG. 7. Ray 705 is directed in a direction that is a mirror image of the direction of ray 702 on the left hand portion of FIG. 7. The ray 704 hits the surface 304 or 304' and is refracted. The surface 703 is flat, so that the ray 704 does not hit it and is not coupled inside the lens. The angle of the exiting ray 704 is then out of range for an effective coupling into a lightguide. The ray 705 hits the surface 307 and is reflected toward the surface 703. Given the flatness of 703, the incident angle of 705 at flat surface 703 is greater than the critical angle for total internal reflection on the surface 307 and therefore is totally reflected upward from the surface 703, instead of being refracted in the lateral direction by the surface 305. This is undesirable.

Figure 8:
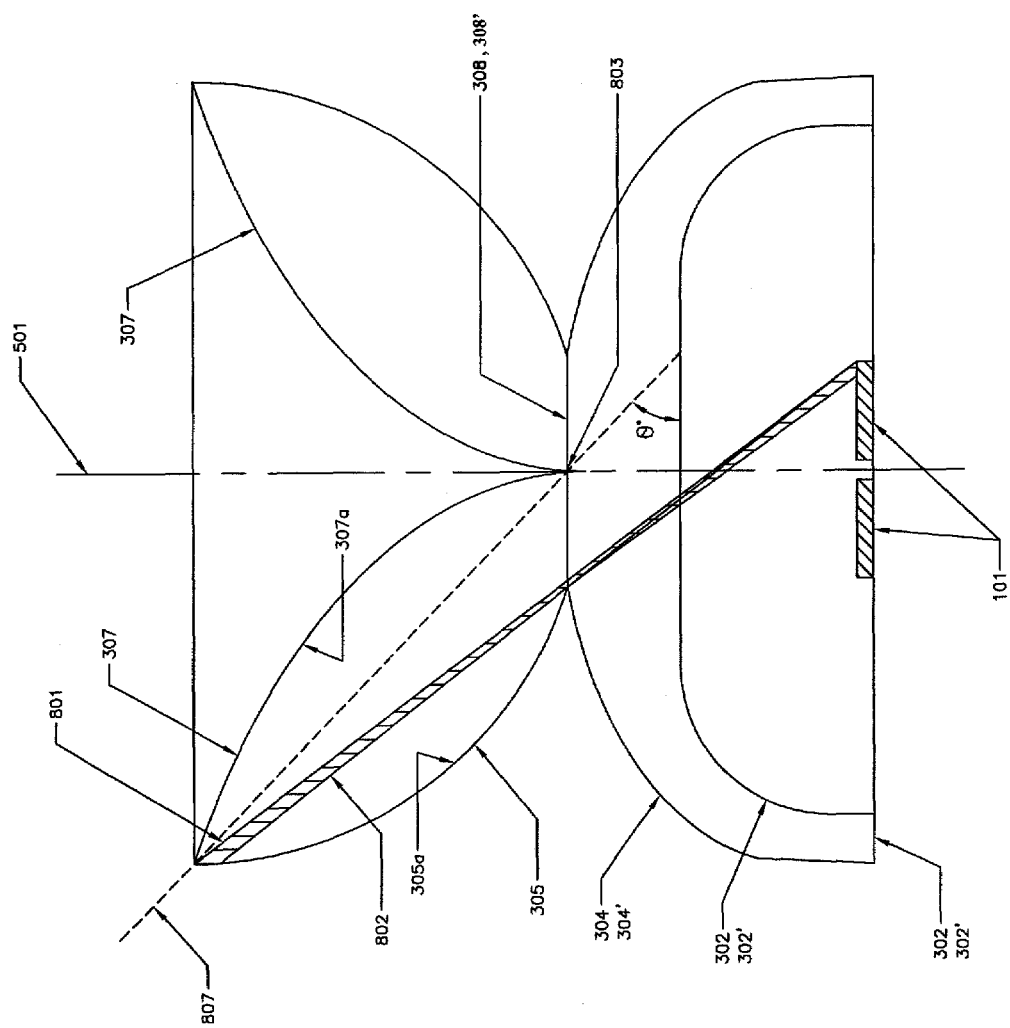
FIG. 8 shows the role of the neck 308 of the lens in FIG. 3c and describes the position of the apex 803 of the funnel shape curve 307, and the relative orientations of the optical surfaces in to illustrate various embodiments of the invention.

The intersection 308 (or 308') of the surfaces 304 (or 304') and 305 is illustrated in FIG. 8. The shape of the intersecting surfaces of the lens will determine the size of the neck 308. The size of this aperture is important because it will limit the number of rays coming from the chips 101 and directly hitting the upper part of the surface 307. The rays 801 and 802 illustrate the critical rays for the surface 305. These kinds of rays have to be limited because they will be reflected upwards directly on the top of the lens and create a bright and non-homogeneous spot above the lens. Any other ray go through the aperture, hit the surface 307 and are reflected towards the side of the lens in a lateral direction as in FIG. 7.

Another important parameter is the curved funnel shape of the surface 307 and the position of its apex 803. This optimized shape will provide an extended area to reflect the maximum of incident rays and therefore redirect more efficiently the light in a lateral direction. The position of the apex 803 will determine the curvature of 307, which is an important parameter. The lower is the position of the apex 803, the higher will be the optical efficiency, but a higher position of apex 803 provides better mechanical strength. The position is adjusted to optimize both of these parameters. Typically the position of 803 relative to a horizontal plane (meaning a plane that is perpendicular to axis 501) defined by intersection surface 308 ranges between −0.5 mm and +0.5 mm.

Thus, curved surface 307 has a concave side 307a illustrated in FIG. 8, where side 307a faces the bottom surface 302 or 302' of the optical system 102 or 102' at an oblique angle. The oblique angle is formed by dotted line 807 that touches the edges of surface 307, and that intersects surface 302 or 302' at an oblique angle θ. The surface 305 also has a concave side 305a, which faces side 307a as shown in FIG. 8. Surface 307 also surrounds optical axis 501, and is preferably rotationally symmetric about axis 501. Surface 304 or 304' preferably extends as a smooth curve from the bottom surface 302 or 302' to surface 305 and connects to it at the neck 308 or 308'. Rays described above and reflected by surface 307, either by total internal reflection, or by a coated surface, are reflected by side 307a of the surface 307.

As described above, embodiments of the present invention overcome the barrier encountered in the prior devices by using a unique and complex combination of curved surfaces. A high level of performance as high as 90% or more of light redirected laterally is achievable in one embodiment with the maximum value of at least one lateral dimension (i.e. dimension along a line perpendicular to axis 501) of the lens less than or below five times the corresponding lateral dimension (i.e. dimension along the same line as the lateral dimension of the lens) of the light emitting area. The vertical dimension (i.e. dimension along axis 501 or a line parallel to axis 501) of the lens is preferably also less than five times the lateral dimension of the light emitting area.

The optical systems 102 and 102' are flexible and can be adapted to any multi-chip configuration. FIG. 9 shows top views of different multi-chip configurations. FIG. 9a is a view of a typical configuration with a single chip centered on the optical axis of the system. FIG. 9b is a view of a 3-chip configuration for a basic RGB cell. FIG. 9c is a view of a 4-chip configuration, which can be used to improve the color rendering by adding a fourth color chip for example. FIG. 9d is a view of a 5-chip configuration for any combination of chips to obtain the maximum of optical power and the best color rendering.

While the invention has been described above by reference to various embodiments, it will be understood that changes and modifications may be made without departing from the scope of the invention, which is to be defined only by the appended claims and their equivalents.

What is claimed is:

1. A lens having an optical axis, comprising:
   a bottom surface;
   a curved reflecting surface having a concave side, wherein said concave side is oriented to face said bottom surface at an oblique angle, said reflecting surface surrounding said optical axis, said reflecting surface being rotationally symmetric about said optical axis;
   a first curved refracting surface having a concave side facing the concave side of the reflecting surface, said first curved refracting surface connected to said curved reflecting surface at a neck; and
   a second refracting surface extending as a smooth curve from the bottom surface and located between the first refracting surface and the bottom surface;
   wherein light entering the lens through the bottom surface and the neck and directly incident on the reflecting surface is reflected from the reflecting surface at its concave side to the first refracting surface and refracted by the first refracting surface to exit the lens in a lateral direction with respect to the optical axis of the lens,
   wherein a first portion of light entering the lens through the bottom surface away from the neck and directly incident on the second refracting surface is refracted by the second refracting surface to exit the lens in a lateral direction with respect to the optical axis of the lens, and
   wherein a second portion of light entering the lens through the bottom surface away from the neck and directly incident on the second refracting surface is refracted by the second refracting surface to the first refracting surface, refracted by the first refracting surface to the reflecting surface, reflected by the reflecting surface at its concave side to the first refracting surface and refracted by the first refracting surface to exit the lens in a lateral direction with respect to the optical axis of the lens.

2. The lens of claim 1, wherein said surfaces are effective to redirect light emission from multiple semiconductor devices in a lateral direction with respect to the optical axis.

3. The lens of claim 2, said multiple semiconductor devices having a combined light emitting area that has a lateral dimension in a direction perpendicular to the optical axis, wherein a maximum dimension of the lens in a direction perpendicular to the optical axis is less than five times the lateral dimension of the light emitting area.

4. The lens of claim 1, said lens having a vertical dimension along or parallel to the optical axis of the lens, said vertical dimension being below five times the lateral dimension of the light emitting area.

5. The lens of claim 1, said lens comprising a molded part, wherein said lens comprises a material that comprises one or more of the following: Polymethyl Methacrylate, Zeon Chemicals Zeonex®, Topas TOPAS® COC or Dow Corning SR-7010.

6. The lens of claim 1, said lens comprising a material having an index of refraction in the range of about 1.4 to about 1.7.

7. The lens of claim 1, said reflecting surface reflecting light either by total internal reflection or by coated reflection.

8. The lens of claim 1, said reflecting surface comprising a metallic reflective material film, a thin dielectric film, or a combination thereof.

9. The lens of claim 1, said second refracting surface having a pyramidal shape with curved triangular faces.

10. The lens of claim 1, said pyramidal shape having a substantially square or rectangular base.

11. A light-emitting system comprising:
at least one light-emitting semiconductor device; and
a lens having an optical axis, comprising:
a bottom surface;
a curved reflecting surface having a concave side, wherein said concave side is oriented to face said bottom surface at an oblique angle, said reflecting surface surrounding said optical axis, said reflecting surface being rotationally symmetric about said optical axis;
a first curved refracting surface having a concave side facing the concave side of the reflecting surface, said first curved refracting surface connected to said curved reflecting surface at a neck; and
a second refracting surface extending as a smooth curve from the bottom surface and located between the first refracting surface and the bottom surface;
wherein light from the at least one semiconductor device entering the lens through the bottom surface and the neck and directly incident on the reflecting surface is reflected from the reflecting surface at its concave side to the first refracting surface and refracted by the first refracting surface to exit the lens in a lateral direction with respect to the optical axis of the lens,
wherein a first portion of light from the at least one semiconductor device entering the lens through the bottom surface away from the neck and directly incident on the second refracting surface is refracted by the second refracting surface to exit the lens in a lateral direction with respect to the optical axis of the lens, and
wherein a second portion of light from the at least one semiconductor device entering the lens through the bottom surface away from the neck and directly incident on the second refracting surface is refracted by the second refracting surface to the first refracting surface, refracted by the first refracting surface to the reflecting surface, reflected by the reflecting surface at its concave side to the first refracting surface and refracted by the first refracting surface to exit the lens in a lateral direction with respect to the optical axis of the lens.

12. The system of claim 11, said system comprising multiple semiconductor devices, wherein said surfaces are effective to redirect light emission from the multiple semiconductor devices in a lateral direction with respect to the optical axis.

13. The system of claim 12, said multiple semiconductor devices having a combined light emitting area that has a lateral dimension in a direction perpendicular to the optical axis, wherein a maximum dimension of the lens in a direction perpendicular to the optical axis is less than five times the lateral dimension of the light emitting area.

14. The system of claim 11, said lens having a vertical dimension along or parallel to the optical axis of the lens, said vertical dimension being below five times the lateral dimension of the light emitting area.

15. The system of claim 11, said lens comprising a molded part, wherein said lens comprises a material that comprises one or more of the following: Polymethyl Methacrylate, Zeon Chemicals Zeonex®, Topas TOPAS® COC or Dow Corning SR-7010.

16. The system of claim 11, said lens comprising a material having an index of refraction in the range of about 1.4 to about 1.7.

17. The system of claim 11, said reflecting surface reflecting light either by total internal reflection or by coated reflection.

18. The system of claim 17, said reflecting surface comprising a metallic reflective material film, a thin dielectric film, or a combination thereof.

19. The system of claim 11, said system comprising multiple semiconductor devices, said bottom surface defining therein a cavity containing the multiple semiconductor devices.

20. The system of claim 19, further comprising a material in said cavity for protection of the at least one light-emitting semiconductor device, increase of light scattering, index matching or increase of light extraction.

21. The system of claim 20, said material having an index of refraction in the range of about 1.4 to about 1.7.

* * * * *